United States Patent [19]

Nakamura et al.

[11] 4,201,435

[45] May 6, 1980

[54] INTERCONNECTORS

[75] Inventors: Akio Nakamura; Ryoichi Sado, both of Saitama, Japan

[73] Assignee: Shin-Etsu Polymer Co. Ltd., Tokyo, Japan

[21] Appl. No.: 968,676

[22] Filed: Dec. 12, 1978

Related U.S. Application Data

[63] Continuation-in-part of Ser. No. 818,218, Jul. 22, 1977, abandoned.

[30] Foreign Application Priority Data

Jul. 26, 1976 [JP] Japan .............................. 51-99296[U]

[51] Int. Cl.² ........................ B32B 25/20; H01R 13/40
[52] U.S. Cl. .......................... 339/59 M; 339/DIG. 3; 339/17 M; 428/364; 428/372; 428/391; 428/397
[58] Field of Search ............... 428/364, 357, 372, 367, 428/368, 391, 373, 397; 339/59 M, 59 R, 63 M, 63 R, 17 M, DIG. 3

[56] References Cited

U.S. PATENT DOCUMENTS

| | | | |
|---|---|---|---|
| 3,991,463 | 11/1976 | Squitieri et al. | 339/59 M |
| 3,998,513 | 12/1976 | Kobayashi et al. | 339/59 M |
| 4,009,296 | 2/1977 | Lob et al. | 427/54 |

FOREIGN PATENT DOCUMENTS

| | | | |
|---|---|---|---|
| 2726742 | 5/1978 | Fed. Rep. of Germany | 339/59 M |
| 23673 | 2/1976 | Japan . | |

*Primary Examiner*—Lorraine T. Kendell
*Attorney, Agent, or Firm*—Toren, McGeady and Stanger

[57] ABSTRACT

A novel and improved rod-shaped interconnector having a structure of an electrically conductive material and an electrically insulating material, at least one of them being flexible, arranged alternatively in strata, which is provided with electrically insulating coating layers on the lateral surfaces having no direct contribution to electric conduction. The interconnectors are safe from the defective phenomenon of surface leakage especially in a highly humid atmosphere.

1 Claim, 5 Drawing Figures

INTERCONNECTORS

BACKGROUND OF THE INVENTION

This is a continuation-in-part application of the U.S. application Ser. No. 818,281, filed July 22, 1977 now abandoned.

The present invention relates to a novel and improved interconnector of a stratified structure useful for electrically connecting electric circuits between two separate electronic circuit boards or between an electronic circuit board and a separate electronic functional unit.

In recent times, wide applications have been directed to the electric connection of circuits in various kinds of precision electronic devices, using miniature interconnectors with a stratified structure prepared by cutting an integral body of multi-laminar stratification composed of alternate layers of an electrically conductive material and an electrically insulating material, at least one of them being flexible, or an electrically conductive rubber and an electrically insulating rubber, in the direction of stratification to form contact points with the electrically conductive material exposed on the surfaces thus cut (see, for example, U.S. Pat. No. 3,998,513).

The interconnectors of the above type have generally been employed by being disposed between two electronic circuit boards each having a plurality of contact points, so that each pair of the contact points located at opposite positions become electrically connected through the corresponding electrically conductive portion of the interconnector. The prior art interconnectors of this type have the peripheral surfaces having no contribution to electrical connection kept bare and exposed to the ambient atmosphere. As a result, the prior art interconnectors often suffer from surface leakage of current especially when used in a highly humid atmosphere.

The phenomenon of surface leakage is partly due to the formation of dew by congealment of the atmospheric moisture and partly due to the spreading of very fine dust particles of the electrically conductive material over the whole surfaces of the interconnector manufactured. The phenomenon of surface leakage is more remarkable when the flexible interconnector is used as being bent, especially on the surface at the inner side.

Further, there may be possibilities of mistake in setting the interconnector when the pitches in the arrangement of the contact points on the two circuit boards to be connected differ from each other or the pitches in the arrangement of the contact points on one of the circuit boards and in the stratification of the interconnector differ from each other. Furthermore, the extremely miniaturized dimensions of the interconnectors of this type tend to bring about difficulties in distinguishing the exact direction of electric connection, resulting in consequent decreases in the efficiency of assembly work of electronic devices with such interconnectors built in.

SUMMARY OF THE INVENTION

The object of the present invention is therefore to provide an interconnector of the stratification type with a novel and improved structure free from the above-described problems encountered in the prior art interconnectors of the type with which marked advantages are obtained in the enhanced reliability in the electric connection between the electronic circuit boards even with a smaller and uniform contacting pressure over the contacting area and reduced penetration of atmospheric moisture and dust.

Thus, the interconnector of the present invention is provided with a coating layer of an electrically insulating material on at least one of its opposite, lateral surfaces that have no contribution to electric connection. In particular, it is recommended that the thickness of the above-mentioned insulating coating layer on the lateral surface of the rod-shaped stratified body is equal to or larger than the width of the lateral surface of the rod-shaped stratified body having contribution to electric connection and the hardness of the material for forming the above-mentioned insulating coating layer does not exceed 50 in the JIS scale and is smaller by at least 10 in JIS scale than that of the electrically conductive rubbery material for the conductive strata in the stratified body. Further, the hardness of the electrically insulating rubbery material of the insulating strata in the stratified body preferably is smaller by at least 5 in the JIS scale than that of the electrically conductive rubbery material for the conductive strata.

BRIEF DESCRIPTION OF THE DRAWINGS

The foregoing and other features according to the present invention will be better understood from the following descriptions and the drawings in which:

FIG. 1 is a schematic cross-sectional view of a liquid crystal display unit with the interconnector of the present invention built in.

DETAILED DESCRIPTION OF THE PREFERRED EMBODIMENTS

Figure 1:
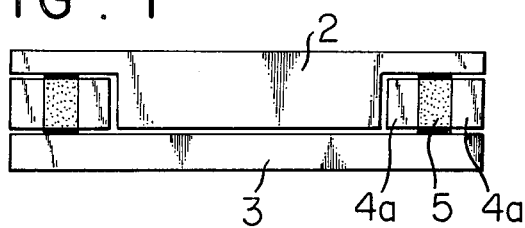
Figure 2:
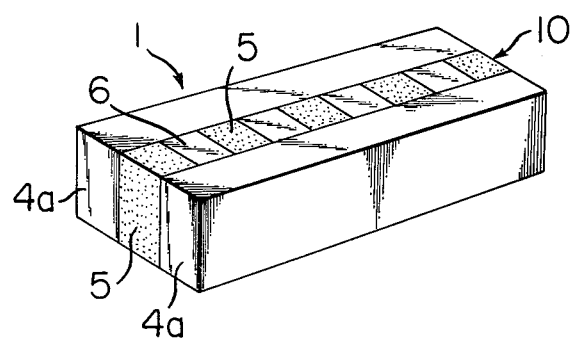
FIG. 2 is a perspective view of the interconnector as built in the liquid crystal display unit shown in FIG. 1.

Now referring to FIG. 1, two interconnectors 1 are put between a liquid crystal cell 2 and an electronic circuit board 3, whereby liquid crystal cell 2 is electrically connected to be driven. Referring to FIG. 2, coating layers 4a, 4a are provided on both opposite lateral surfaces of a stratified body 10. The coating layers are made of an electrically insulating material. The interconnector shown in FIG. 3 has two insulating coating layers 4a, 4b on both opposite lateral surfaces of a stratified body 10, the thickness of the coating layer 4a being larger than the width of the stratified body 10 but the thickness of the coating layer 4b being smaller than the width of the stratified body 10.

Figure 4:
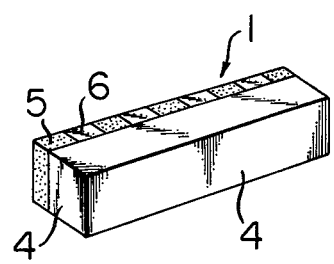
FIG. 4 is a perspective view of another embodiment of the inventive interconnector provided with only one insulating coating layer on either one of the lateral surfaces of the stratified body.
Figure 5:
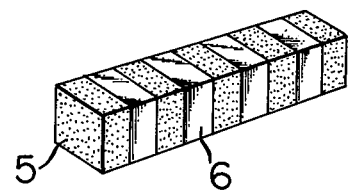
FIG. 5 is a perspective view showing the prior art interconnector with no insulating coating layers on its lateral surfaces.

FIG. 4 shows a similar coating layer 4 provided on only one of the lateral surfaces of the stratified body 10. To contrast, FIG. 5 is given to illustrate the prior art interconnector that has no insulating coating layer on any lateral surfaces.

Figure 3:
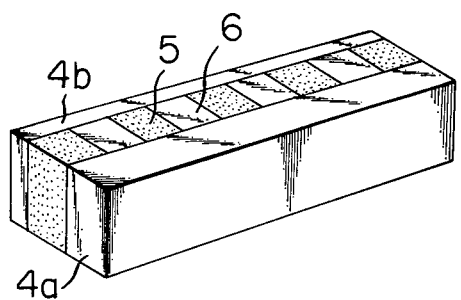
FIG. 3 is a perspective view of the inventive interconnector having two insulating coating layers on the lateral surfaces of the stratified body, the thickness of one of the coating layers being larger than the width of the stratified body but the thickness of the other one of the coating layers being smaller than the width of the stratified body.

Among the three embodiments shown in FIGS. 2 to 4, the most preferred is that shown in FIG. 2 in which both of the insulating layers have a thickness exceeding the width of the stratified body.

Stratified body 10 per se is formed by an alternate stratification of an electrically conductive material (area 5 as indicated in FIG. 2) and an electrically insulating material (area 6 as indicated in FIG. 2), at least one of which is flexible. In the most preferred embodiment, a silicone rubber is used for both of these materials, the silicone rubber filled with a carbon black or metal powder being the electrically conductive material.

It is recommended that the hardness of the electrically insulating material forming the insulating strata is smaller by at least 5 in the JIS scale than that of the electrically conductive rubbery material forming the conductive strata in order to ensure better contact with the electronic circuit board and the like.

The materials used for the coatng layer to be formed on the surface of the stratified body having no direct contribution to electric connection are not limitative insofar as a good adhesion is obtained between the stratified body per se and the coating layer. Their examples are thermoplastic resins, such as polyethylene, polypropylene, polyvinyl chloride and the like; thermosetting resins, such as phenolic resins and the like; and rubbery polymers, such as natural rubber and various synthetic rubbers, preferably flexible, and they may be chosen according to the material of the stratified body per se. In particular, when the material of the stratified body per se is a silicone rubber, electrically conductive or insulating, the recommended material for the coating layers is also a silicone, such as a silicone rubber. The material for the coating layers may be colored, if desired, by adding a suitable coloring agent, such as a pigment or a dye.

The material for the insulating coating layer is also subject to preference in the hardness in order to ensure improved reliability in the electric connection. For example, the hardness of this insulating material should not exceed 50 and should be smaller by at least 10 in the JIS scale than that of the rubbery material forming the conductive strata in the stratified body.

The procedure for providing the electrically insulating coating layer on the predetermined surface of the stratified body per se is not limitative. For example, any of the above-exemplified materials for the coating layer may be applied as such or as a solution to the surface. As a further example, a film formed of the material is placed and adhesively bonded to the surface. Furthermore, it is a convenient practice that the coating layer is formed by spreading over the surface a pasty composition of a silicone rubber curable at room temperature or with heat at a moderate temperature, followed by in situ curing of the composition to form a cured silicone rubber layer. The thickness of the electrically insulating coating layer thus formed can be as thin as possible insofar as a good electric insulation is ensured, or usually from a few micrometers up to a few millimeters.

However, it is recommended that the thickness of the electrically insulating coating layer is as large as equal to or larger than the width of the stratified body per se along the surface in contribution to the electric connection. With the thickness of the layer as specified above, additional advantages are obtained in preventing the penetration of atmospheric moisture and/or dust into the interstices formed between the interconnector and the electronic circuit board and the like as well as in the uniformity of the contacting pressure between the surface of the stratified body and the electronic circuit board and the like.

The coating layer or layers provided on the surfaces can serve, in addition to the effect of decreasing surface leakage of current, to reinforce the stratified body per se which may be very thin.

The structure of the interconnector of the present invention is not limited to those as shown by FIGS. 2 to 4. Various modifications in design are possible in order to meet the intended use of the interconnector with respect to cross-sectional shape and the position where the coating layer or layers are provided.

As has been described in the foregoing, the interconnector of the present invention is provided with electrically insulating coating layers on the lateral surfaces having no direct contribution to electric connection and very effective in preventing the phenomenon of surface leakage when used in a highly humid atmosphere, compared to the prior art interconnectors. Further practical advantage is that the handling of the interconnector is convenient because of the insulating coating layers which serve as distinguishing marks for locating the right direction of the interconnector.

EXAMPLE 1

A rod-shaped body of a stratified structure was prepared by cutting an alternate stratification of electrically insulating silicone rubber sheets and carbon black-filled electrically conductive silicone rubber sheets, each sheet having a thickness of 0.125 mm. This stratified body (which was of Type S manufactured and sold by Shin-Etsu Polymer Co., Ltd.) was 20 mm in length and 1 mm (wide) by 2 mm (high) in cross section, with the pitch of 0.25 mm. The opposite lateral surfaces each having the 2 mm (high) by 20 mm (long) dimension were coated with a room-temperature-vulcanizing silicone rubber (KE 45 RTV, product of Shin-Etsu Chemical Co., Japan) in a thickness of 2 mm and cured by allowing to stand at room temperature for 24 hours.

The interconnector thus prepared was contacted with a pair of platinum electrodes on the uncoated 1 mm×20 mm surfaces under compression of about 5% in the direction of height and kept in an atmosphere having a relative humidity of 90±5% at 40° C. for 100 hours under attenuation of a D.C. voltage of 5 volts between the electrodes. After the end of the above testing time, no increase in the surface leakage was found.

The surface contacting resistance of the inter connector and the platinum electrode was measured for 10,000 pieces of the similar interconnectors having the same dimensions as above to find that the contacting resistance varied within the range of about $10^2$ to $10^3$ ohms per square millimeter of the contacting area when the stratified body was under compression of 5%.

For comparison, similar interconnectors were prepared with the thickness of each of the insulating layers equal to 0.5 mm. The contacting resistance between these interconnectors and the platinum electrode measured with 10,000 pieces of the interconnectors ranged from $10^3$ to $10^4$ ohms when the compression was about 5% while it was necessary to increase the compression to about 10% in order to have a decreased contacting resistance in the range of $10^2$ to $10^3$ ohms.

EXAMPLE 2

The same interconnector as prepared in Example 1 was bent around a mandrel by a 90° angle by bringing one of the insulating layers into contact with the mandrel so that the curvature on the inner surface of the stratified body was with a 2.5 mm radius and the insulating resistance between two adjacent electroconductive strata in the stratified body was found to be almost unchanged in comparison with the value of about $10^{11}$ ohms in an unbent interconnector.

Similarly, the interconnector prepared for the comparative purpose in Example 1 with 0.5 mm thick insulating layers was subjected to the same test to find that the insulating resistance between two adjacent electroconductive strata in the stratified body with the same curvature was decreased to about $10^6$ ohms.

What is claimed is:

1. An interconnector comprised of a rod-shaped stratified body with a rectangular cross section formed with strata of an electrically insulating rubbery material and strata of electrically conducting rubbery material in an alternate stratification along the longitudinal direction of the rod-shaped stratified body and two electrically insulating layers of a rubbery material each adhesively bonded to and covering an opposite lateral surface of the rod-shaped stratified body, the hardness of the electrically insulating rubbery material for the strata in the stratified body being smaller by at least 5 in the JIS scale than that of the electrically conductive rubbery material, the hardness of the rubbery material forming the insulating layers not exceeding 50 and smaller by at least 10 in the JIS scale than that of the electrically conductive rubbery material in the stratified body and the thickness of each of the insulating layers being larger than the width of the stratified body between the opposite surfaces to which the insulating layers are bonded.

* * * * *